(12) United States Patent
Rehder (10) Patent No.: US 10,177,265 B2
(45) Date of Patent: Jan. 8, 2019

(54) BONDING USING CONDUCTIVE PARTICLES IN CONDUCTING ADHESIVES

(71) Applicant: The Boeing Company, Chicago, IL (US)

(72) Inventor: Eric M. Rehder, Los Angeles, CA (US)

(73) Assignee: The Boeing Company, Chicago, IL (US)

( * ) Notice: Subject to any disclaimer, the term of this patent is extended or adjusted under 35 U.S.C. 154(b) by 405 days.

(21) Appl. No.: 14/987,567

(22) Filed: Jan. 4, 2016

(65) Prior Publication Data

US 2017/0194526 A1    Jul. 6, 2017

(51) Int. Cl.
| | |
|---|---|
| *B23K 1/00* | (2006.01) |
| *H01L 31/05* | (2014.01) |
| *B32B 7/12* | (2006.01) |
| *B32B 7/04* | (2006.01) |
| *B32B 15/16* | (2006.01) |

(Continued)

(52) U.S. Cl.
CPC ............ *H01L 31/0512* (2013.01); *B32B 5/16* (2013.01); *B32B 7/04* (2013.01); *B32B 7/12* (2013.01); *B32B 15/01* (2013.01); *B32B 15/043* (2013.01); *B32B 15/16* (2013.01); *B32B 37/04* (2013.01); *B32B 37/12* (2013.01); *B32B 38/0036* (2013.01); *C09J 5/00* (2013.01); *H01L 31/043* (2014.12); *B32B 2037/1269* (2013.01); *B32B 2305/30* (2013.01); *B32B 2307/202* (2013.01); *B32B 2457/00* (2013.01); *C09J 2201/602* (2013.01); *C09J 2203/326* (2013.01)

(58) Field of Classification Search
CPC .............. B23K 1/0016; B23K 2201/40; H05K 2201/0233; H05K 3/323; H05K 2201/0215; C09J 9/02
See application file for complete search history.

(56) References Cited

U.S. PATENT DOCUMENTS

| | | |
|---|---|---|
| 8,283,558 B2 | 10/2012 | Kukulka |
| 8,664,517 B2 | 3/2014 | Kukulka |

(Continued)

FOREIGN PATENT DOCUMENTS

WO    WO-2014033983 A1 *  3/2014    ............. H05K 3/323

OTHER PUBLICATIONS

Anthony, T. R. et al., "Interstitial Diffusion of Gold and Silver in Indium", Physical Review, vol. 151, No. 2, Nov. 11, 1996, pp. 495-498.

*Primary Examiner* — Erin B Saad
(74) *Attorney, Agent, or Firm* — Kwan & Olynick LLP (57) ABSTRACT

An anisotropic conducting adhesive is improved in conductivity without increasing the density of admixed conductive particles by inducing metallic fusion between the surfaces of the conducting particles and the surfaces being bonded. The metallic fusion may be promoted by physical/chemical interaction characteristic of certain materials at a compressed interface; by compression sufficient to deform the conductive particles in a manner that increases the mechanical contact area; by heating (with or without melting of a material), which may also serve to cure the adhesive matrix; or by acoustic vibration, e.g., ultrasonic vibration. The resulting metallic-fusion joint is stronger, as well as more conductive, than a joint in which the particles and surfaces are held in unfused mechanical contact.

20 Claims, 8 Drawing Sheets

(51) Int. Cl.
*B32B 15/04* (2006.01)
*B32B 37/12* (2006.01)
*B32B 5/16* (2006.01)
*B32B 37/04* (2006.01)
*B32B 38/00* (2006.01)
*H01L 31/043* (2014.01)
*C09J 5/00* (2006.01)
*B32B 15/01* (2006.01)

(56) References Cited

U.S. PATENT DOCUMENTS

| | | | |
|---|---|---|---|
| 2008/0213613 A1* | 9/2008 | Kuramoto | B23K 3/0623 |
| | | | 428/577 |
| 2011/0233793 A1* | 9/2011 | Miura | B23K 1/0016 |
| | | | 257/779 |
| 2014/0170810 A1* | 6/2014 | Oi | H01L 23/498 |
| | | | 438/108 |
| 2015/0007864 A1 | 1/2015 | Chiu et al. | |
| 2015/0208509 A1* | 7/2015 | Sakai | H05K 3/323 |
| | | | 361/751 |

\* cited by examiner

BONDING USING CONDUCTIVE PARTICLES IN CONDUCTING ADHESIVES

BACKGROUND

Bonding may be used for manufacturing items with laminar, interlocking, or other distinct components. For example, various layers of solar cells may be bonded together. Wafers and other substrates may be bonded, as may subassemblies and complete devices.

Polymer adhesives and industrial-grade adhesive films may create strong, uniform attachments between a variety of materials and surface profiles. Items can be bonded by polymer adhesives whether or not the mating surfaces are smooth or the contours fit together perfectly. Some adhesives provide a somewhat flexible bond between materials with different coefficients of thermal expansion. Material and capital costs may be lower for adhesives than for other bonding methods.

Most adhesives are intrinsically insulating, both electrically and thermally, which is often advantageous. Yet, there are some applications for which an electrically or thermal conductive bond is desired. One adaptation has been the introduction of anisotropic conducting adhesives with conducting particles that form conductive paths between the mating surfaces. The primary design trade-off in formulating anisotropic conducting adhesives is between (1) higher particle density for higher conductivity or (2) lower particle density for smoother flow, better adhesion, and more resilience under thermal or mechanical stress.

SUMMARY

A conducting adhesive may provide substantial conductivity (both electrical and thermal) without increasing the density of admixed conductive particles and thereby impacting the mechanical and bonding properties of the adhesive. The conductivity is achieved by forming bonds between the surfaces of the conducting particles in the adhesive and the surfaces of component being bonded. These particular bonds may be formed by intermixing metals of the conducting particles and metals of the bonded components and may be referred to as fusion bond or, more specifically, metallic fusion to distinguish from other types of bonds and electrical contacts, such as direct interface, crimping, and the like. The metallic fusion may be formed by alloying two or more metals provided by different components, e.g., one metal provided by the conducting particles and another metal provided by the surface of the component fused to this particle. As such, there is no defined interface between the conducting particles and the component after the metallic fusion is established. The particles and the components effectively form one continuous monolithic structure. Unlike conventional electrical contacts with defined interfaces between two connected components, the metallic fusion provides lower contact resistance and as a result may utilized a lot fewer particles in the adhesive to form the same type of contact. The mechanical fusion may be formed by physical (e.g., diffusion) interaction, metallurgical interaction and/or chemical interaction of the metals of two fused components. In some embodiments, the two components may be heated to a temperature sufficient for the fusion to occur. The heating may be also a part of the adhesive curing that the particles are parts of.

The particles used in the adhesive may be sufficiently compressible and, in some embodiments, may initially be larger in size than the final thickness of the adhesive layer. This sizing ensures that the particles contacts both components on each side of the adhesive layer. Furthermore, the compression increases the mechanical contact area to one or both components. Some compression may also help to ensure that a non-conducting adhesive is displaced from the interface between the particles and the components. In addition to or instead of heating and compression, various other techniques may be used to form the metallic fusion may include acoustic vibration, e.g., ultrasonic vibration. The resulting metallic-fusion joint is stronger, as well as more conductive, than a conventional connection in which the particles and surfaces are held in unfused mechanical contact, e.g., compressed against each other.

Provided are methods of forming conductive bonds. In some examples, a method may include stacking a first component and a second component such that a first conductive surface portion of the first component faces a second conductive surface portion of the second component. An adhesive layer is disposed in between and in contact with both of the first conductive surface portion and the second conductive surface portion. For example, the adhesive layer may be formed before or after stacking. The adhesive layer includes one or more conductive particles embedded in an adhesive matrix. The method may proceed with compressing the first component and the second component against each other, causing compression of the adhesive layer therebetween. The method may also include forming at least one unbroken conductive path from the first conductive surface portion to the second conductive surface portion by metallic fusion, where the conductive path includes at least one of the conductive particles.

In some examples, the method may also include forming the metallic fusion by heating the adhesive layer during the compression of the adhesive layer. In the same or other example, forming the metallic fusion may involve vibration of the first component relative to the second component during the compression of the adhesive layer. Furthermore, roughening the first conductive surface portion or the second conductive surface portion may be performed before the forming of the adhesive layer. Likewise, roughening the conductive particles may be performed before the forming of the adhesive layer, e.g., introducing the conductive particles into the adhesive matrix.

One or more of the following features may be included in some examples. The compression of the adhesive layer may deform the one or more of the conductive particles to form the conductive path. This deformation of the particles ensures more contact surface between the particles and structures to which adhesive is applied to. For example, a spherical particle may have a point contact with the surface. After deformation, the spherical particle turns into an oval particle which has a much larger surface contact. The thickness of the adhesive matrix may be less than a maximum diameter of the conductive particles before the compressing. A part of the metallic fusion may be formed while curing the adhesive matrix. The metallic fusion may include diffusion between two metals. One having ordinary skill in the art would understand that these are non-limiting examples and other types of metals may be used as well.

The adhesive layer may be applied to one surface or both surfaces before the stacking. If non-conductive surface portions are present on the first component and the second component, these portions may be substantially free from the adhesive layer. At least one void in the adhesive matrix may be eliminated during the compression. For example, the adhesive matrix may be redistributed during compression and fill new areas where adhesive may have not been initially present (e.g., that would have otherwise formed voids).

Forming the metallic fusion may involve at least partially melting one or more metals or, more specifically, heating to a temperature exceeding a melting temperature of one metal but not necessarily another metal. For example, a fusion between indium and gold may be performed at a temperature of between about 160° C. and 250° C. or, more specifically, between about 180° C. and 220° C., such as at about 200° C. This temperature exceeds the melting temperature of indium but is far below the melting temperature of gold. Without being restricted to any particular theory, it is believed that without experience significant melting indium rapidly forms an alloy with gold that may have a melting temperature exceeding the heating. The rate of alloying may actually exceed the rate of melting. Furthermore, the heating temperature may be selected based on curing of the adhesive matrix. In some examples, the adhesive matrix is heated to a temperature of between about 150° C. and 300° C. or other ranges specified elsewhere in this disclosure.

The conductive path established by the metallic fusion may be electrically conductive and by remaining conductive portions of the conductive particles. The conductive path may be also thermally conductive. Unless specifically noted in this disclosure, the conductivity refers to an electrical conductivity. However, one having ordinary skills in the art would understand that an electrical conductive path is also generally thermally conductive.

Provided also is a manufactured article, which may include a first component attached to a second component by an adhesive layer between a first conductive surface portion of the first component and a second conductive surface portion of the second component. The adhesive layer may include one or more conductive particles embedded in an adhesive matrix. At least one of the conductive particles may be metallically fused with the first conductive surface portion, the second conductive surface portion, or another one of the conductive particles.

The manufactured article may also include an interface layer between the adhesive layer and the first conductive surface portion or the second conductive surface portion the interface layer comprises conductive bodies and a primer matrix.

The adhesive matrix may be electrically insulating and/or thermally insulating. The conductive particles may include one or more layers formed around an inner core. For example, the conductive particles may include one or more conductive shells formed around a polymer core. The polymer core may be compressible. The average diameter of the conductive particles may be between 1 micron and 50 microns.

In some examples, the conductive particles occupy less than 10%° of the bonded area between the first conductive surface portion and the second conductive surface portion or, more specifically, less than 1% or even less than 0.1% or even less than 0.01%. This ratio may depend on the conductivity needed between the first conductive surface portion and the second conductive surface portion. However, one having ordinary skills in the art would understand that this ratio is much smaller for the conductive particles having metallic fusion to the first conductive surface portion and the second conductive surface portion than, for example, for conventional conductive adhesive where no metallic fusion is established. Furthermore, having a large portion of the conductive particles contacting both the first conductive surface portion and the second conductive surface portion eliminates the need for particle-to-particle contact and allows using much few conductive particles resulting in the smaller ratios as listed above.

The first conductive surface portion may have a different coefficient of thermal expansion from the second conductive surface portion. Since these conductive surface portions are thin, their coefficient of thermal expansions may have less impact than for example, coefficient of thermal expansions of other components. The difference in coefficient of thermal expansions for bulk components may be detrimental as it can cause shifting of the components with respect to each other during temperature changes and even during cool down to room temperature, and may cause breaking of mechanical and/or electrical connections at the interface. Using thin conductive surface portions overcomes this issue while still forming good interface contacts.

The first conductive surface portion, the second conductive surface portion and the conductive particles may include a metal having a melting point less than or equal to a cure temperature of the adhesive matrix. The conductive bodies may be different in size or shape from the conductive particles. At least one of the first conductive surface portion or the second conductive surface portion is part of an electronic device such as a solar cell.

DETAILED DESCRIPTION

The manufacture of electronic devices and other articles may include a large number of processes. The devices themselves may include a large number of parts and materials. To avoid obscuring the disclosure, only those processes, parts, and materials closely related to the disclosed subject matter will be described in detail.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific examples, it will be understood that these examples are not intended to be limiting.

Definitions

The following terms shall have the following meanings for purposes of this document:

Bond or Joint (nouns): Used interchangeably for adhesion between components after all the processes affecting the adhesion are complete.

Bond or Join (verbs): Used interchangeably for a process operation or set of operations to produce adhesion between components.

Component: Generic term including, without limitation, a wafer or other substrate with or without fabricated structures; a die; a chip; a device subassembly; or a device.

Interdiffusion: The diffusion of two or more materials across a contact boundary.

Metallic fission: Migration of at least one metal species across a mechanical contact joint, wholly or partially dissolving the boundary between the joined objects, and in some embodiments, forming a metal alloy or mix.

Self-diffusion: The diffusion of a material into a like material across a contact boundary.

Introduction

A number of different approaches may be used for inter-diffusing conductive materials across a contact boundary and, in some cases, eliminate part or all of the boundary. The boundaries are generally not desirable from the electrical conductivity, thermal conductivity, mechanical bonding, and other perspectives. The boundaries can be detected while being examined using scanning electron microscope (SEM) or similar methods. Specifically, a contact boundary is visible as a line in an SEM image as further described below with reference to FIGS. 4A-4B. This is the result of conducting materials not being in direct contact, which may be due to a barrier layer remaining between the conducting surfaces. This barrier layer could be formed by remaining adhesive, for example. The elimination of that boundary, even if only partial, increases both the electrical conductivity, the thermal conductivity, and the mechanical strength of the interface.

The direct contact between metallic surfaces provides electrical conduction between these surfaces. Depending on metals and processing details there may be little to no bonding between the two surfaces and the surfaces may have a simple mechanical contact. This connection is at risk of having a high resistance contact and/or losing the contact when, for example, some stress is applied (e.g., the pressure between the two surfaces is lost). A more robust connection can be accomplished by inter-diffusing metals of contacting components, as in metallic fusion. As defined above, the metallic fusion involves migration of at least one metal species across a mechanical contact joint, wholly or partially dissolving the boundary between the joined objects, and in some embodiments, forming a metal alloy or mix. In some cases, the metallic fusion involves melting at the mechanical contact interface. Some conductive materials melt at relatively low temperatures that may fall within the temperature range for curing the adhesive matrix, or at least within a temperature range that the adhesive matrix and the rest of the assembly can tolerate. For example, indium, tin, lead, and some of their alloys melt at temperatures below 350 C.

Another mechanism of fusion is acoustic vibration combined with compression. The energy from the vibration may induce very localized melting as in thermoplastic ultrasonic welding, or non-melting fusion as in some metallic ultrasonic welding where the metal goes into a plastic state at temperatures lower than the melting temperature.

Some metals will interdiffuse or self-diffuse without melting. For example, gold and indium interdiffuse at temperatures below the melting point of either element or at least below the melting temperature of gold (and above the melting temperature of gold). When two metals which do not form a continuous series of solid solutions interdiffuse, each phase in equilibrium at the diffusion temperature may appear as a separate layer in the fusion zone. When gold and indium interdiffuse, a major component of the fusion zone may be $AuIn_2$, with other intermediate phases such as $Au_9In_4$, AuIn, and $Au_4In$ in much narrower layers. Interdiffusion coefficients of the four intermediate phases and the terminal solid solutions lie in the range of $2.4 \times 10^{-13}$ to $1.8 \times 10^{-11}$ $cm^2$/sec.

Both silver and gold diffuse interstitially in indium, though silver diffuses substitutionally in indium as well, possibly influenced by the relatively low van der Waals forces in silver as compared to gold. Gold requires 7 kcal/mole of activation energy for diffusion, but silver diffusion requires an additional 5 kcal/mole to activate silver from a substitutional to an interstitial site before silver interstitial diffusion can occur. Without being restricted to any particular theory it is believed that copper may dissolve interstitially in indium faster than either gold or silver. Furthermore, when forming indium-gold contact, it is believed that more indium moves into the gold component than gold moving into the indium component.

In general, monovalent metals such as gold, silver, copper, and platinum may readily diffuse into trivalent metals such as indium, gallium, thallium, and aluminum. Without being restricted to any particular theory, it is believed that the valence may control the type of intermixing between metals of the two surface portions. For example, a monovalent metal may substitutionally dissolve in a trivalent metal. Group 11 (formerly Ib) metals are known to diffuse rapidly into interstices of Group 13 (formerly IIIa) and Group 14 (formerly IVa) post-transition metals. In addition, some materials, such as indium and silver, are prone to self-diffusion; indium atoms from one mating surface may diffuse into the indium on the other surface, and vice versa.

Interdiffusion and self-diffusion are temperature-dependent; plots of the dependencies are available in the literature. Moreover, interdiffusion may occur more rapidly in thin films than in bulk materials if the thin films have higher densities of grain boundaries and other defects than the bulk materials.

The bonding or interdiffusion of metals helps to establish high conductivity through a few distributed particles. The interdiffusion may proceed into the semiconductor layers, which is undesirable. A diffusion barrier may be included in the metal contact layers to prevents migration of metal atoms into adjacent semiconductor layers. This can be accomplished, for example, with a nickel layer or, more generally, with a nickel containing layer that separates metal layers forming the metal-to-semiconductor contact and the metal layers forming the bond to the conductive particles More fusion area can occur with the same number and size of particles if the particles are flattened to enlarge the area of contact. The flattening may be a result of the compression. Specifically, the compression may cause the particles to change their shape (e.g., deform) resulting in a larger contact surface between the particles and another surface which the particle contacts (e.g., forms an electrical contact and may interdiffuse). Compression of the particles or surface metal layers also protects the mating surfaces from high forces that can lead to damage or cracking. Gold, silver, annealed copper, indium, tin, and lead are all soft, deformable metals. Another approach is to coat compressible polymer particles with one or more thin layers of metals.

Compression may be used to bring the conducting surfaces into close proximity. However, a thin adhesive layer may still remain between the surfaces and particles. To address this issue with remaining materials and material redistribution, rough surfaces may be used. These surfaces include spikes capable of penetrating through the adhesive barrier layer and bring the conducting surfaces into direct local contact. Additionally, in some vibration-assisted examples the peaks may "focus" the vibrations to initiate fusing.

Thermal conductivity may be important in a bond, as well as or instead of electrical conductivity. Gold, silver, and copper are highly thermally conductive and electrically conductive.

Examples of Adhesive Bonds with Metallic Fusion

Figure 1:
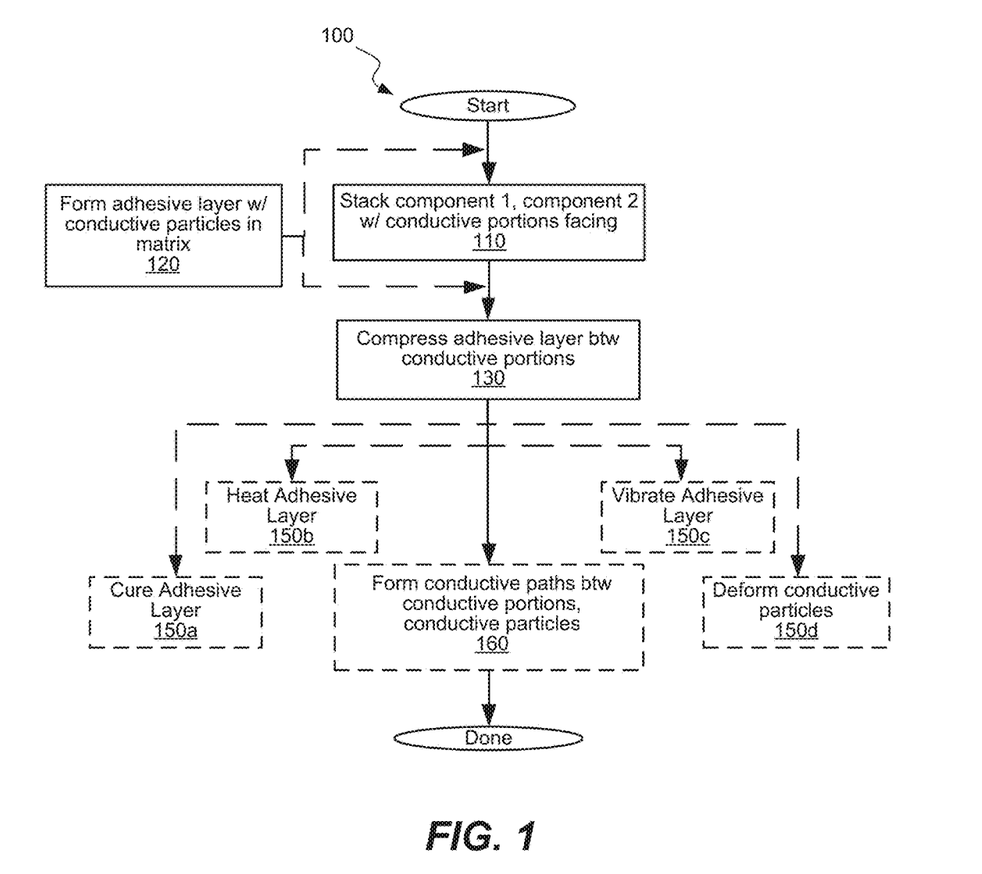
FIG. 1 is a flowchart of an example method for joining components by fusing conductive particles with conductive surfaces.

FIG. 1 is a flowchart of an example method for joining components by fusing conductive particles with conductive surfaces. At operation 110 a first component and a second component are stacked so that conductive portions on their surfaces are facing each other. The overlap between the conductive portions may be complete or partial. At operation 120 an adhesive layer, including conductive particles in an adhesive matrix, is formed between the facing surfaces of the components. The adhesive layer may be formed before stacking the components, e.g., by applying it to one of the components and stacking the other component over the adhesive layer. Alternatively, the adhesive layer may be formed after stacking the components, e.g., by inserting or injecting it into a gap between the facing surfaces of the components.

At operation 130 the adhesive layer is compressed between the facing surfaces of the components. The compression may be selected to suit the particular embodiment of the process. For example, the applied pressure may be above a threshold for partial flattening the conductive particles or, if a conductive material is being melted, below a threshold for unacceptably raising the melt temperature. Overall, the compression may deform the particles and increase their contact area.

While the stack is compressed, measures to promote metallic fusion or otherwise improve conductivity or strength may be implemented. Non-limiting examples include operation 150a of curing the adhesive layer, operation 150b of heating the adhesive layer, operation 150c of vibrating the adhesive layer, or operation 150d of deforming the particles. The time overlap between the compression and, if any, the assistive process(es) may be partial or entire.

At optional operation 160, the particles form uninterrupted conductive paths between the facing surfaces of the components by fusing the conductive particles with the surfaces. It should be noted that in some examples, the conductive paths may be formed during earlier operations such as one or more of operations 150a-150d described above. The process of forming these conductive paths will now be described in more detail with reference to FIGS. 2A-2F, which illustrate examples of adhesive layers in component stacks. In some embodiments, operation 160 is a part of operation 130. In other words, uninterrupted conductive paths are formed while compressing the first component and the second component toward each other.

Figure 2A:
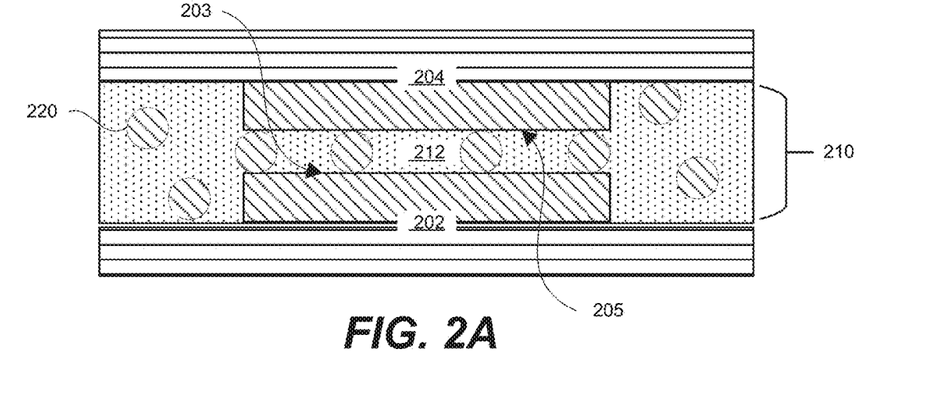
FIGS. 2A-2G, which illustrate examples of adhesive layers in component stacks.
Figure 2B:
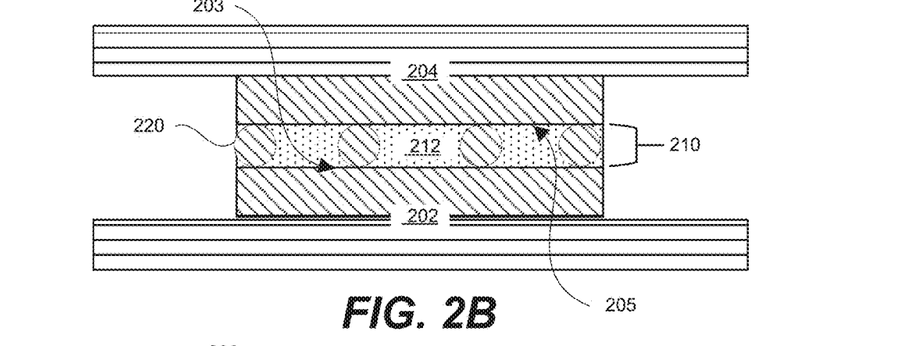
Figure 2C:
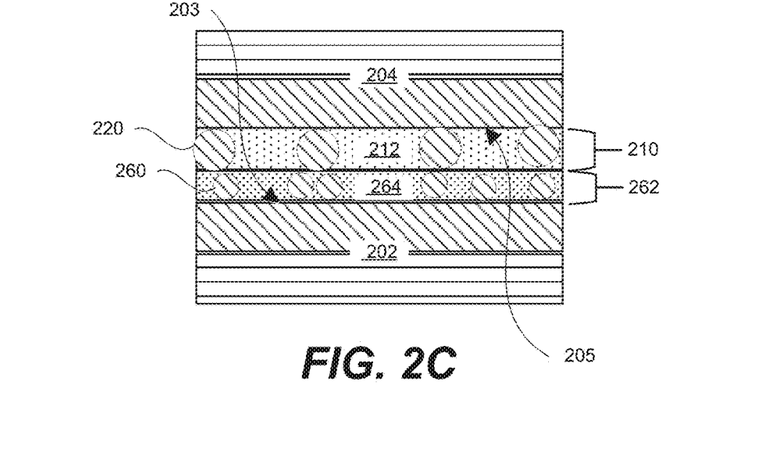

Specifically, FIGS. 2A-2C illustrate different adhesive-layer configurations. In FIG. 2A, components 202 and 204 are stacked with conductive surface portions 203 and 205 facing each other. In the illustrated embodiment adhesive layer 210, including conductive particles 220 and adhesive matrix 212, fills the entire space between component 202 and component 204. For example, adhesive layer 210 may have been applied to the entire surface of one or both of the components, or may have been injected between the components. Yet conductive particles 220 only form conductive paths between conductive surface portion 203 and conductive surface portion 205, where the gap is equal to or preferably less than one particle-diameter wide. In some examples, adhesive layer 210 is formed in places where electrical connections and mechanical connections are needed between component 202 and component 204 other areas may be free from adhesives. The selection of component 202 or component 204 may be set by various processing aspects, such as orientations of component 202 and component 204.

In some embodiments, both component 202 and component 204 have corresponding portions of adhesive layer 210 formed on their surfaces prior to stacking component 202 and component 204 with adhesive layer 210 in between component 202 and component 204. This approach may be used to ensure that both surfaces have sufficient contact (e.g., wetting) with adhesive.

In FIG. 2B, adhesive layer 210 is only present between conductive surface portions 203 and 205 and not between the other surface portions of components 202 and 204. For example, the adhesive may have been applied only to one or both of the conductive surface portions 203 and 205 rather than the entire surface of component 202 or component 204. As in FIG. 2A, the gap is approximately one particle-diameter wide to fuse one side of a conductive particle 220 with each of conductive surface portion 203 and conductive surface portion 205.

In FIG. 2C, an additional interface layer 262 is between conductive surface portion 203 and adhesive layer 210. Interface layer 262 includes conductive bodies 260 embedded in primer matrix 264. Primer matrix 264 may have the same composition as adhesive matrix 212 or it may have a different composition. The size, shape and outermost material of conductive bodies 260 may be the same as those of conductive particles 220, or any number of those characteristics may be different. For example, the size of conductive bodies 260 may be driven by the thickness of interface layer 262 and/or various aspects of primer matrix 264. The composition of conductive bodies 260 may be selected to ensure bonding to primer matrix 264 while the composition of conductive particles 220 may be selected to ensure bonding to adhesive matrix 212.

Interface layer 262 may be used, for example, as a primer layer when conductive surface portions 203 and 205 are made of dissimilar materials. For example, there may be no available adhesive matrix 212 that adheres acceptably to both conductive surface portion 203 and conductive surface portion 205, but primer matrix 264 adheres acceptably to conductive surface portion 205 and adhesive matrix 212. Additionally or alternatively, conductive particles 220 may easily fuse with conductive surface portion 203 but not with conductive surface portion 205, while conductive bodies 260 may easily fuse with conductive surface portion 205 and conductive particles 220.

Figure 2D:
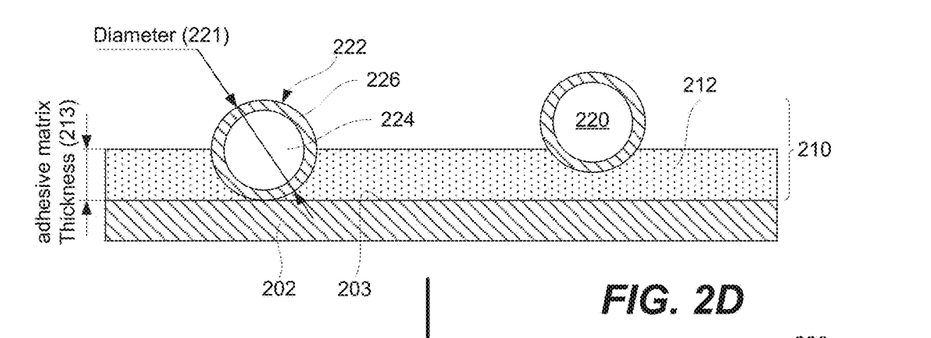
Figure 2E:
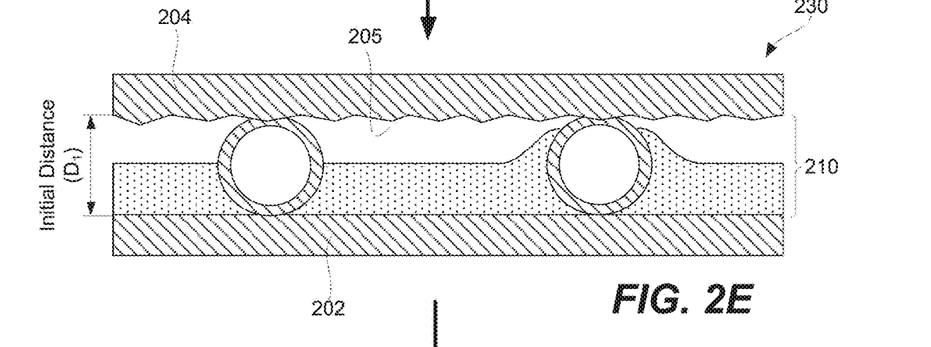
Figure 2F:
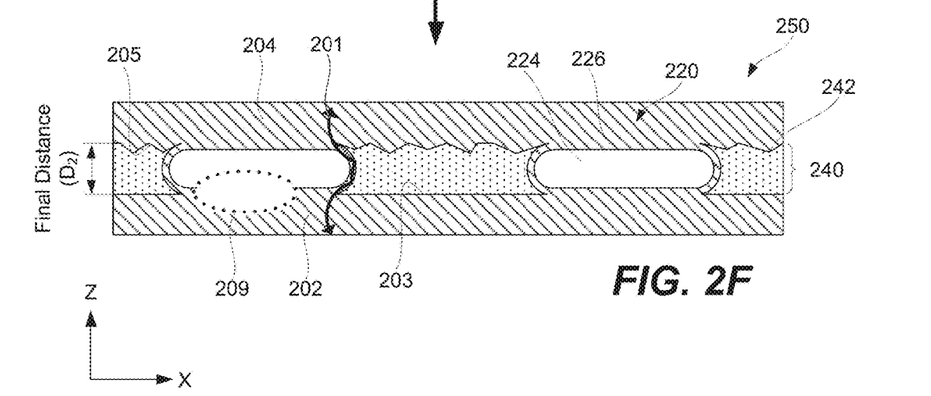

FIGS. 2D-2F illustrate successive stages of an assembly process example. In FIG. 2D, the mixture of adhesive matrix 212 and conductive particles 220 is applied to conductive surface portion 203 of component 202. Although an initial thickness of adhesive layer 210 is approximately one particle diameter 221, adhesive matrix thickness 213 is less than one particle diameter 221 to avoid outflow of excess adhesive matrix 212 from the gap edges when conductive particles 220 are flattened. Particle diameter 221 may be, for example, between 1 and 50 microns.

As shown in FIG. 2D, conductive particles 220 include conductive shells 228 surrounding polymer cores 224. Conductive shells 228 may be fabricated as a single layer or as multiple layers, and may include pure metals, alloys, or other electrically or thermally conductive compounds.

In some embodiments, conductive particles 220 are solid metal particles without any cavities provided within conductive particles 220. Specifically, solid metal particles 220 may consist essentially of a metal element. In other words, the composition of solid metal particles 220 may be such that the metal element represents at least about 95% by weight of solid metal particles 220 or, more specifically, at least about 99% or even at least about 99.9%. Alternatively, solid metal particles 220 may comprise a metal alloy.

In FIG. 2E, component 204 is positioned over adhesive layer 210 with conductive surface portion 205 facing conductive surface portion 203 to form stack 230. Under normal gravity alone (without extra compression), an initial distance D1 between conductive surface portions 203 and 205 is approximately one particle diameter 221. In the illustration, conductive surface portion 205 of component 204 is roughened. Experimental results have shown that this roughening may enhance bond conductivity and strength. Either conductive surface portion 205 or outer surfaces 222 of conductive particles 220 may be roughened, either in the course of deposition or by post-processing. For example, the RMS roughness may be between 1% and 50% of particle diameter 221 or, more specifically, between about 5% and 25% or even between 7% and 15%. Another feature is an average spacing between surface features, which may be particularly small for this application, such as less than about 10% of particle diameter 221 or, more specifically, less than about 5% or even less than about 1%.

If grain boundaries and other defects are increased (in the course of the roughening or some other process operation), diffusion may be promoted, making the bond stronger and more conductive. This runs counter to conventional goals of making thin films as defect-free as possible, and may thereby constitute an unexpected result.

FIG. 2F shows interconnected assembly 250 after compressing conductive particles 220, at least partially curing adhesive matrix 212, and fusing conductive shells 228 of conductive particles 220 with conductive surface portions 203 and 205. The curing of adhesive matrix 212 may ensure that the established distance between components 202 and 204 is maintained and that the contact between components 202 and 204 and conductive particles 220 is preserved. In other words, the cures adhesive is used as a support element. Fusing conductive shells 228 of conductive particles 220 with conductive surface portions 203 and 205 may happen during curing and/or after curing. The final distance D2 between conductive surface portions 203 and 205 is illustrated as approximately equal to initial adhesive matrix thickness 213, but in some examples it may be thicker or thinner. In the illustration, conductive particles 220 are compressed to about half their original height, but in some examples they may be compressed more, or less, or not at all. As described elsewhere in this disclosure, the metallic fusion helps to lower the electrical contact resistance between components 202 and 204 and conductive particles 220 and maintain this electrical connection.

In regions of metallic fusion such as 209, the initial continuous boundary between conductive shells 228 and conductive surface portions 203 and 205 may become spatially intermittent or disappear entirely under, e.g., SEM examination. This boundary dissolution created continuous conductive paths such as 201 between conductive surface portions 203 and 205. Mechanical strength of the joint is enhanced by metallic fusion 209, which works with adhesive matrix 212 to hold components 202 and 204 together. In some examples, regions of metallic fusion 209 may contribute more strength to the joint than adhesive matrix 212 contributes. Compressed polymer cores 224 have maintained their integrity inside conductive shells 228, but in some examples their outlines may be distorted or disrupted.

In some examples, outer surfaces 222 of conductive particles 220 and conductive surface portions 203 and 205 may include the same soft, self-diffusing, low-temperature-melting, or ultrasonically weldable conductive material. In some examples, outer surfaces 222 of conductive particles 220 and conductive surface portions 203 and 205 may include different soft, interdiffusing, low-temperature-melting, or ultrasonically weldable conductive materials.

Part of the metallic fusion process may coincide with curing adhesive matrix 212. For example, one or more fusing metals may melt at a temperature less than or equal to the cure temperature of adhesive matrix 212. For example, the fusing metal may melt and adhesive matrix 212 may cure at temperatures between 150 C and 350 C.

Conductive particles 220 may be 90-100% homogeneous, may be made of a conductive shell 228 around an insulating core 224, or may be made of a diffusion-prone metal shell 228 over a conductive but diffusion-resistant core 224. Conductive shells 228 may be single-layer or multi-layer. Diameters 221 of conductive particles 220 may be uniform to within +/−20% of the average diameter. Distribution density of conductive particles 220 within adhesive layer 210 may be uniform within +/−10% of an average density. In some examples, conductive particles 220 may occupy less than 10% of the bonded area between conductive surface portions 203 and 205 or, more specifically, less than 1% or even less than 0.1% or even less than 0.01%. Even at this low coverage of conductive surface portions 203 and 205, conductive particles 220 may provide sufficient conductivity between conductive surface portions 203 and 205 suitable for many applications, such as solar cells. The reasons for high conductivities at such low coverages may include low interface resistance between conductive surface portions 203 and 205 and conductive particles 220 (e.g., due to interdiffusion), short conductive path between conductive surface portions 203 and 205 established by the thickness of adhesive layer 210, and other factors.

Conductive surface portions 203 and 205 may be made of the same material(s) or different materials. The different materials may have different coefficients of thermal expansion. Specifically, the first conductive surface portion may have a different coefficient of thermal expansion from the second conductive surface portion. Sine these conductive surface portions are thin (e.g., less than 1 micrometer), their coefficient of thermal expansions may have less impact than for example, coefficient of thermal expansions of other components. The difference in coefficient of thermal expansions for bulk components may be detrimental as it can cause shifting of the components with respect to each other during thermal cycling and may cause breaking of mechanical and/or electrical connections at the interface. Using thin conductive surface portions overcomes this issue while still forming good interface contacts.

Components 202 and 204 may be, for example, parts of a solar cell. Specifically, one of conductive surface portions 203 and 205 may be a part of the backside of the solar cell, which is connected to a circuit using interconnected assembly 250.

Figure 2G:
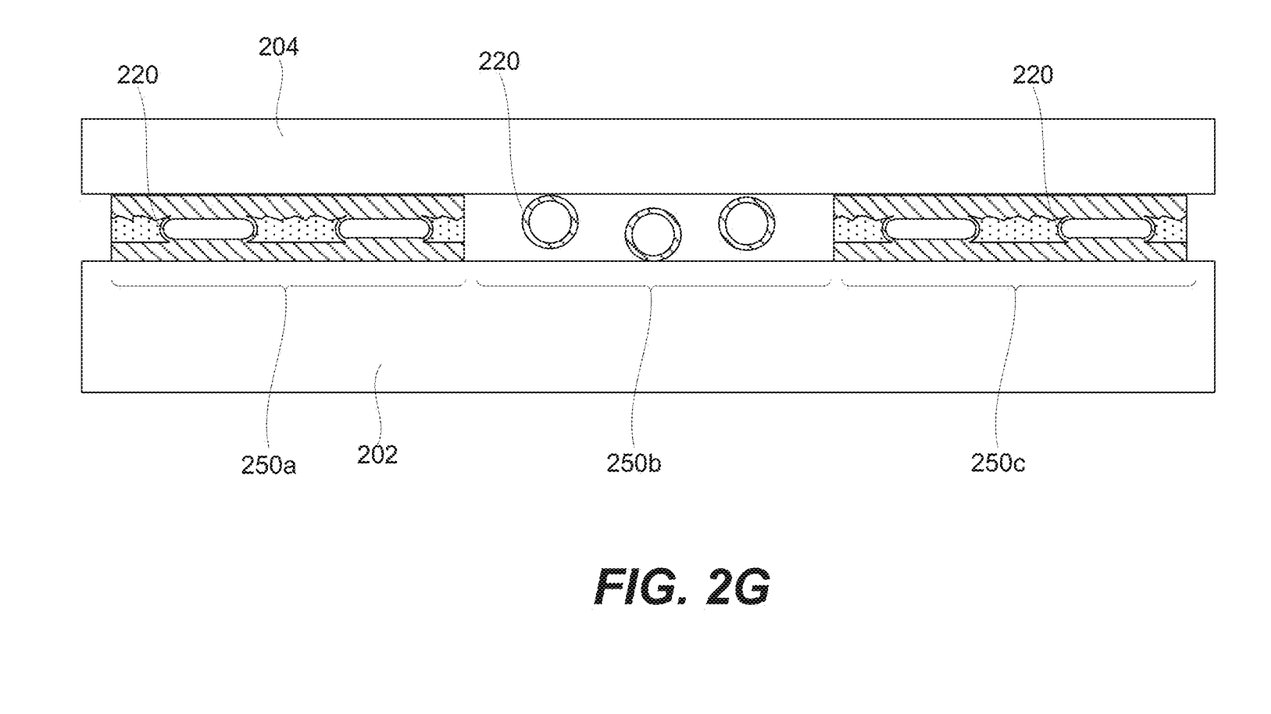

FIG. 2G is a schematic representation of another example of the stack including components 202 and 204 having two separate contacts 250a and 250c. Contacts 250a and 250c are independent from each other and, in some embodiments, may be electrically isolated from each other. Contacts 250a and 250c may be formed in the same operation when stacking components 202 and 204 and compressing these components 202 and 204 against each other. It should be noted that, in some embodiments, an adhesive layer comprising one or more conductive particles embedded in an adhesive matrix may be disposed between components 202 and 204 in areas of contacts 250a and 250c as well as other areas. However, when compressing components 202 and 204 against each other electrical connections between components 202 and 204 may be formed only in the areas of contacts 250a and 250c and, for example, not in other areas, such as area 250b identified in FIG. 2G. In some embodiments, electrical connections may be formed in areas where conductive particles 220 are sufficiently compressed and brought in contact with both components 202 and 204 and not formed where conductive particles 220 are not compressed. For example, the distance between components 202 and 204 in area 250b may be greater than the diameter of conductive particles 220. With low concentration of conductive particles 220 in the adhesive matrix these conductive particles may not form conductive paths between components 202 and 204. On the other hand, the distance between components 202 and 204 in the areas of contacts 250a and 250c may be smaller than the diameter of conductive particles 220 and conductive paths are formed as described above. Other approaches of controlling position of contacts 250a and 250c as between components 202 and 204 may be materials used to form surfaces of components 202 and 204 facing each other, processing techniques (e.g., pressure, temperature, vibration) applies to different areas between components 202 and 204, for example.

Experimental Data

Figure 3A:
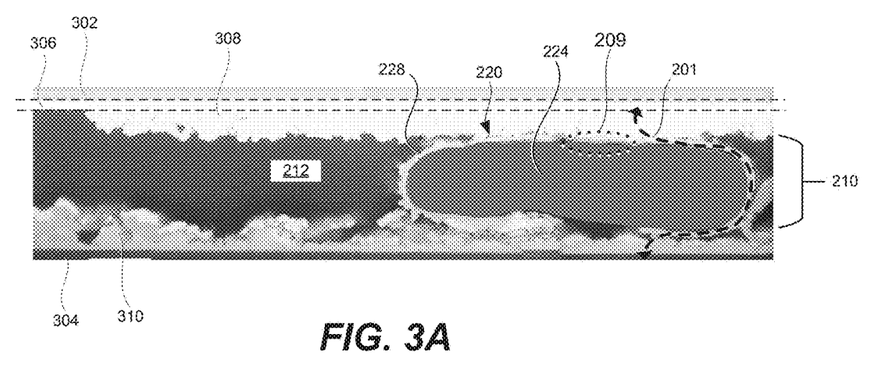
FIGS. 3A and 3B are secondary electron microscope images of a cross-section of a pair of wafers (element 302 and 304) bonded with metallic fusion (region 209) provided by a conducting adhesive.
Figure 3B:
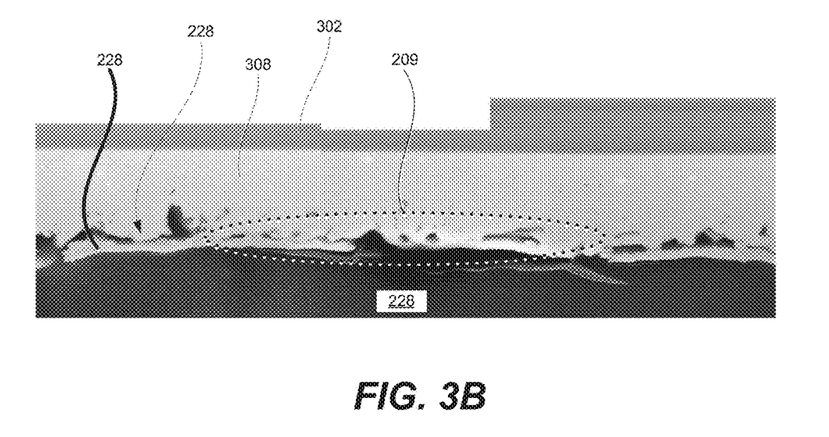

FIGS. 3A and 3B are secondary electron microscope images of a cross-section of a pair of wafers (element 302 and 304) bonded with metallic fusion (region 209) provided by a conducting adhesive. Wafers 302 and 304 were sectioned with a focused ion beam and adhesive layer 210 was imaged edge-on.

FIG. 3A illustrates a bottom portion of wafer 302 having smooth gold contact 306. The boundary of gold contact 306 are identified by two dashed lines in FIG. 3A. A non-contact portion of wafer 302 is disposed above the top dashed line, while gold contact 306 is disposed between the two dashed lines. In this example, gold contact 306 was about 500 nm thick. Furthermore, in this example, wafer 302 was a part of a III-V solar cell.

A light area below the bottom dashed line in FIG. 3A represents gold-indium mixture 308. Specifically, gold from gold contact 306 fused with indium to form gold-indium mixture 308. This fusing process may be also referred to as a reaction of gold and indium or alloying of gold and indium.

A bottom dark colored object represents second wafer 304. Contact 310 shown by a light colored object is disposed above second wafer 304. In this example, contact 310 included a 2.3 um thick indium layer, which developed its roughness during deposition.

Adhesive layer 210 includes conductive particle 220 and adhesive matrix 212. In this example, adhesive matrix 212 (darker area between gold-indium mixture 308 and contact 310) was a polymer adhesive with a nominal thickness of about 12 microns. Conducting particles 220 were highly uniform in diameter included spherical polymer cores 224 with gold-over-nickel conductive shells 228. Polymer cores 224 corresponds to a darker area surrounded by lighter area representing gold-over-nickel conductive shells 228.

The indium from contact 310 of wafer 304 has reacted with gold conductive shell 228 of conductive particles 220 and has been transported to the gold layer to wafer 302 or, more specifically, to contact 306 thereby forming gold-indium mixture 308. The indium from contact 310 has thus reacted and fused with conductive shell 228 of particle 220 over large amounts of their shared contact area including fused region 209. Some of the indium has transported to gold contact 306 of solar cell and fused conductive shells 228 of particle 220 with the gold/indium of the gold layer. Because of the metallic fusion of conductive shell 228 to conductive surface portions 203 and 205, current may flow between the silicon wafer and the III-V solar cell along an uninterrupted path such as conductive path 201.

FIG. 3B is a magnification of a region in FIG. 3A along top contact 306 and metallic fusion region 209 formed by top contact 306 with particle 220. Metallic fusion region 209 reveals effects of the interdiffusion of indium and gold between conductive shell 228 and contact 306 or, more specifically, portion 308 of contact 306 formed during the overall process. Specifically, metallic fusion region 209 is one location in particular where a solid, continuous metal joint is observed between conductive shell 228 and conductive surface portion 205.

Figure 4A:
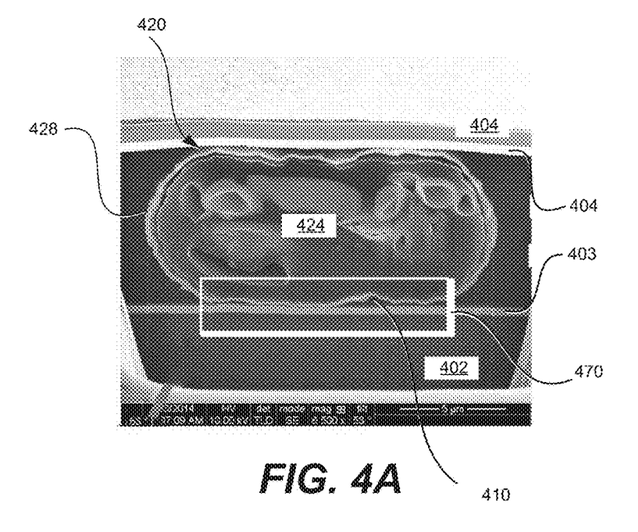
FIGS. 4A and 4B shows a conventional joint structure using conducting adhesive without metallic fusion.
Figure 4B:
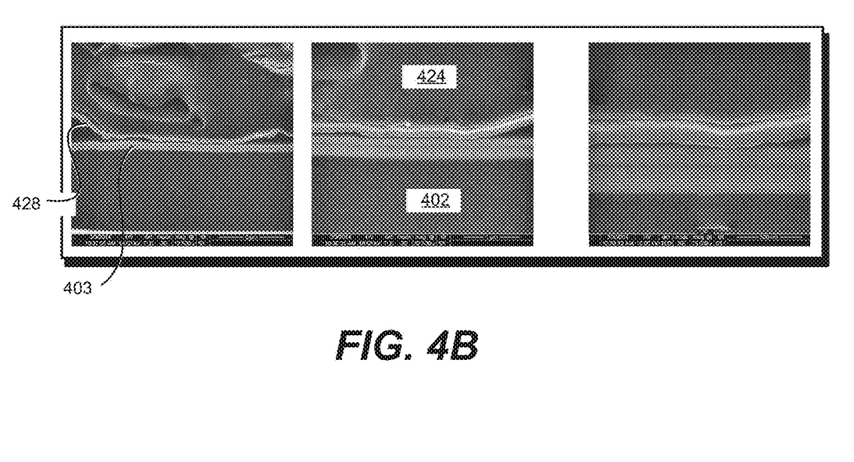

FIGS. 4A and 4B shows a conventional joint structure using conducting adhesive without metallic fusion. Specifically, FIG. 4A shows conductive particle 420, which includes polymer core 424 and conductive shell 428. Polymer core 424 may be compressible. Conductive particles 420 is disposed and compressed between two smooth gold conductive surface portions 403 and 405 thereby forming an electrical connection between conductive surface portions 403 and 405. While conductive shell 428 have some direct contact with conductive surface portions 403 and 405 the boundaries between conductive shell 428 and conductive surface portions 403 and 405 are discernible, indicating an absence of metallic fusion. Furthermore, some adhesive 410 remains between conductive shell 428 and conductive surface portions 403 and 405 further interfering with the electrical connection.

FIG. 4B shows a series of magnified images of the region of FIG. 4A enclosed in rectangle 470. These images confirm that there is high compression of the particle bringing large areas of the particle in close proximity to the conducting surface. The images also show that the adhesive has a strong tendency to remain between the conductive surfaces and to separate these conductive surfaces. The rightmost image is of high resolution and shows the metal layers separated by a residual adhesive layer that is much less than 100 nm. This residual adhesive is a barrier to forming conductive bonds.

Figure 5:
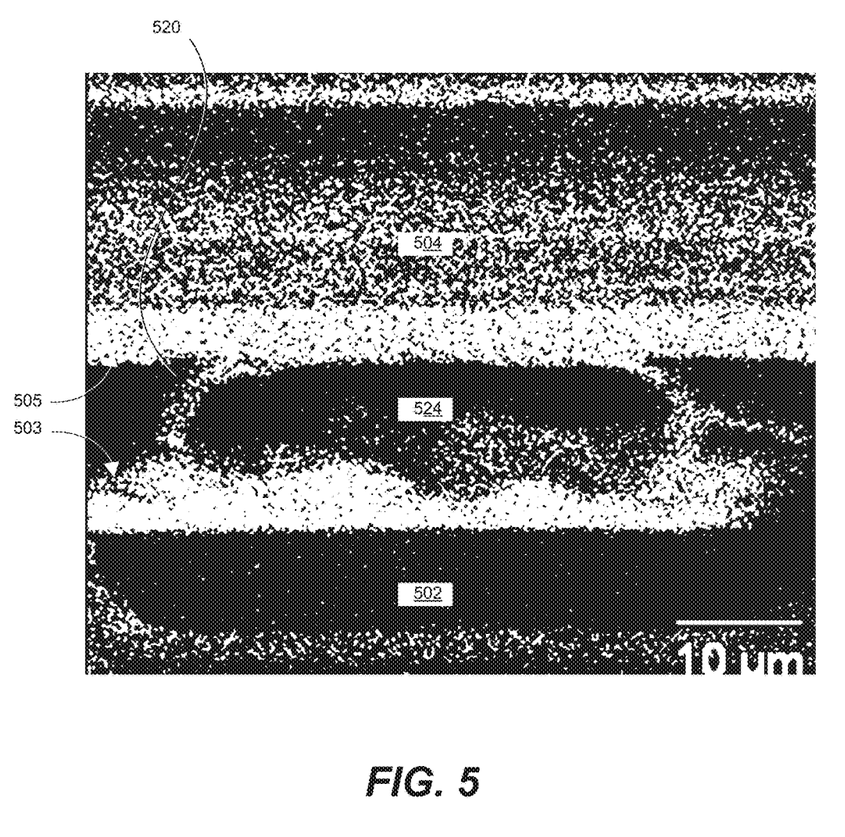
FIG. 5 is an energy-dispersive X-ray (EDX) map of a cross-section of two joined components.

FIG. 5 is an energy-dispersive X-ray (EDX) map of a cross-section of two joined components. The EDX map shows components 502 and 504, conductive surface portions 503 and 505, and polymer core 524 and conductive shell 528 of particle 520. The light areas indicate indium concentration along the top and bottom interfaces and along the metal shell of the particle. The starting structure only consisted of indium in lower conducting surface 503. The roughness of the constituents was able to pierce the residual adhesive layer of FIG. 4. At this point direct metal contact is formed. The high diffusion rate of Indium in Gold drives the fusion process. The indium diffusion across the metal surface of the particle shown in the EDX map. The indium continues to diffuse into the gold conductive surface of 505 as shown in the EDX map. After fusion robust metal connections are to be found between the conducting particle and both conductive surface portions. This forms a large area connection for a low resistance and a strong bond able to survive stresses.

Figure 6:
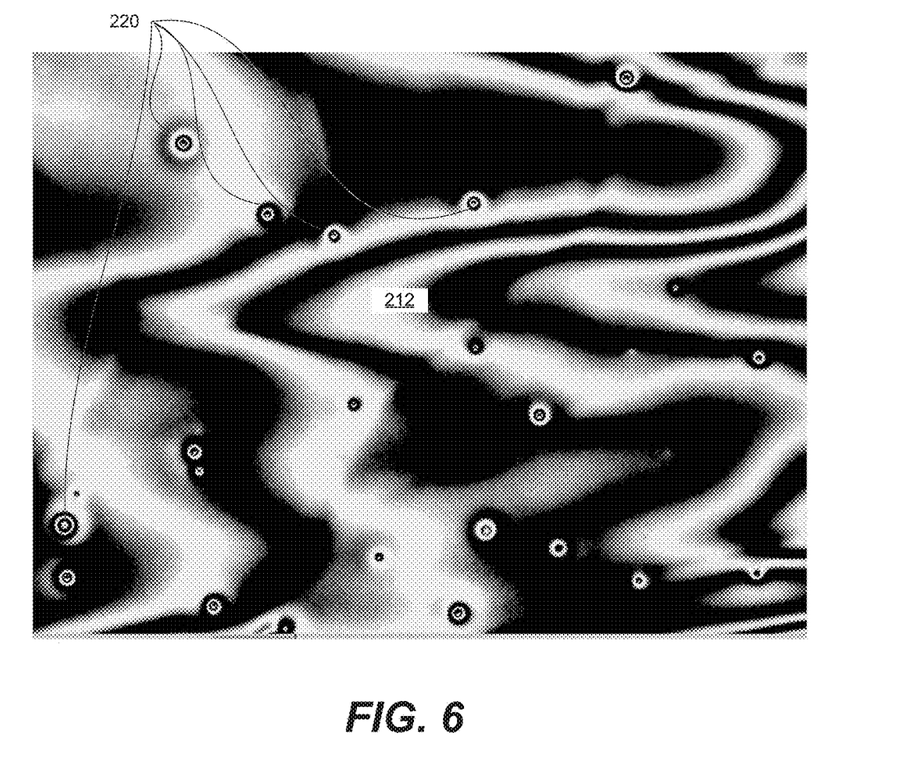
FIG. 6 is an optical surface analyzer image of a spread-out adhesive layer.

FIG. 6 is an optical surface analyzer image of a spread-out adhesive layer. The large wavy features are interference fringes related to variations in film thickness. The "bulls-eye" features indicate the locations of particles 220 in the adhesive matrix 212. The actual particles are the small central circles. The surrounding bulls-eye rings are created by broad "mountains" of adhesive around the particles, similar to what is depicted in the particle on the right hand side of FIG. 2E. This image shows particles with a density of 20/cm$^2$. They are 20 micrometers in diameter, making this a 0.006% coverage.

Different examples of the apparatus(es) and method(s) disclosed herein include a variety of components, features, and functionalities. It should be understood that the various examples of the apparatus(es) and method(s) disclosed herein may include any of the components, features, and functionalities of any of the other examples of the apparatus(es) and method(s) disclosed herein in any combination, and all of such possibilities are intended to be within the spirit and scope of the present disclosure.

Many modifications of examples set forth herein will come to mind to one skilled in the art to which the present disclosure pertains having the benefit of the teachings presented in the foregoing descriptions and the associated drawings.

Therefore, it is to be understood that the present disclosure is not to be limited to the specific examples illustrated and that modifications and other examples are intended to be included within the scope of the appended claims. Moreover, although the foregoing description and the associated drawings describe examples of the present disclosure in the context of certain illustrative combinations of elements and/or functions, it should be appreciated that different combinations of elements and/or functions may be provided by alternative implementations without departing from the scope of the appended claims. Accordingly, parenthetical reference numerals in the appended claims are presented for illustrative purposes only and are not intended to limit the scope of the claimed subject matter to the specific examples provided in the present disclosure.

What is claimed is:

1. A method comprising:
    stacking a first component and a second component such that a first conductive surface portion of the first component faces a second conductive surface portion of the second component and such that an adhesive layer is in contact with both the first conductive surface portion and the second conductive surface portion, wherein the adhesive layer comprises one or more conductive particles having surfaces and embedded in an adhesive matrix;
    compressing the first component and the second component toward each other, causing compression of the adhesive layer therebetween and direct mechanical contact of the surfaces of the one or more conductive particles with each of the first conductive surface portion and the second conductive surface portion; and
    forming metallic fusion between the surfaces of the one or more conductive particles and each of the first conductive surface portion and the second conductive surface portion by diffusing one or more conductive materials from the first conductive surface portion and the second conductive surface portion into the surfaces of the one or more conductive particles thereby establishing a conductive path on the surfaces of the one or more conductive particles between the first conductive surface portion and the second conductive surface portion,
    wherein forming the metallic fusion is performed at a temperature below the melting temperature of the surfaces of the one or more conductive particles.

2. The method of claim 1, wherein compressing the first component and the second component toward each other deforms the one or more conductive particles.

3. The method of claim 1, wherein a thickness of the adhesive matrix is less than an average diameter of the one or more conductive particles before compressing the first component and the second component toward each other.

4. The method of claim 1, further comprising at least partially curing the adhesive matrix while compressing the first component and the second component toward each other.

5. The method of claim 1, wherein the adhesive matrix is cured while forming the metallic fusion.

6. The method of claim 1, wherein the one or more conductive particles are solid particles comprising a metal.

7. The method of claim 1, wherein the one or more conductive particles each comprises one or more conductive layers formed around an inner compressible core.

8. The method of claim 1, wherein the adhesive layer is applied to one or both of the first conductive surface portion and the second conductive surface portion before stacking the first component and the second component.

9. The method of claim 8, wherein, after applying the adhesive layer to the one or both of the first conductive surface portion and the second conductive surface portion, one or more non-conductive surface portions of the first component and the second component are substantially free from the adhesive layer.

10. The method of claim 1, wherein forming the metallic fusion comprising heating at least the adhesive layer while compressing the first component and the second component against each other.

11. The method of claim 1, wherein forming the metallic fusion comprises vibrating the first component relative to the second component while compressing the first component and the second component against each other.

12. The method of claim 1, wherein at least one void in the adhesive matrix is eliminated while compressing the first component and the second component against each other.

13. The method of claim 1, wherein forming the metallic fusion comprises partially melting one or more of the first conductive surface portion and the second conductive surface portion.

14. The method of claim 1, further comprises curing the adhesive matrix at a curing temperature, wherein the curing temperature of the adhesive matrix exceeds a melting temperature of at least one of the first conductive surface portion or the second conductive surface portion.

15. The method of claim 14, wherein the curing temperature of the adhesive matrix is heated to a temperature of between about 150° C. and 300° C.

16. The method of claim 1, further comprising roughening the first conductive surface portion or the second conductive surface portion before stacking the first component and the second component.

17. The method of claim 1, further comprising roughening the conductive particles before stacking the first component and the second component.

18. The method of claim 1, further comprising applying an interface layer to the first conductive surface portion or the second conductive surface portion before stacking the first component and the second component, wherein the interface layer comprises conductive bodies and a primer matrix.

19. The method of claim 1, wherein the one or more conductive materials are selected from the group consisting of indium, tin, and lead.

20. The method of claim 1, wherein the one or more conductive materials are indium.

* * * * *